(12) United States Patent
Yamashita

(10) Patent No.: US 7,816,919 B2
(45) Date of Patent: Oct. 19, 2010

(54) MAGNETIC RESONANCE APPARATUS GANTRY AND MAGNETIC RESONANCE APPARATUS

(75) Inventor: Masatoshi Yamashita, Otawara (JP)

(73) Assignees: Kabushiki Kaisha Toshiba, Minato-Ku, Tokyo (JP); Toshiba Medical Systems Corporation, Otawara-shi, Tochigi-Ken (JP)

( * ) Notice: Subject to any disclaimer, the term of this patent is extended or adjusted under 35 U.S.C. 154(b) by 0 days.

(21) Appl. No.: 12/233,032

(22) Filed: Sep. 18, 2008

(65) Prior Publication Data

US 2009/0079430 A1    Mar. 26, 2009

(30) Foreign Application Priority Data

Sep. 21, 2007    (JP)    ............................. 2007-245448

(51) Int. Cl.
*G01V 3/00*    (2006.01)
(52) U.S. Cl. ........................................ 324/318; 324/321
(58) Field of Classification Search ......... 324/300–322; 600/410, 411, 422
See application file for complete search history.

(56) References Cited

U.S. PATENT DOCUMENTS

| | | | | |
|---|---|---|---|---|
| 3,462,677 A * | 8/1969 | Paitich | ........................ | 324/321 |
| 4,456,881 A * | 6/1984 | Compton | ..................... | 324/319 |
| 4,871,969 A * | 10/1989 | Roemer et al. | .............. | 324/318 |
| 4,875,485 A * | 10/1989 | Matsutani | .................... | 600/415 |
| 4,949,043 A * | 8/1990 | Hillenbrand et al. | ......... | 324/320 |
| 5,555,251 A * | 9/1996 | Kinanen | ...................... | 324/319 |
| 5,786,695 A * | 7/1998 | Amor et al. | .................. | 324/319 |
| 6,160,399 A * | 12/2000 | Radziun et al. | .............. | 324/319 |
| 6,208,141 B1 * | 3/2001 | Amor et al. | .................. | 324/318 |
| 6,556,012 B2 * | 4/2003 | Yamashita | .................... | 324/318 |
| 7,034,537 B2 * | 4/2006 | Tsuda et al. | ................. | 324/320 |
| 7,071,693 B2 * | 7/2006 | Yasuhara | ..................... | 324/319 |
| 7,372,265 B2 * | 5/2008 | Ham et al. | .................... | 324/307 |
| 7,663,366 B2 * | 2/2010 | Takamori | ..................... | 324/318 |
| 2001/0022515 A1 * | 9/2001 | Yamashita et al. | ........... | 324/300 |
| 2003/0107376 A1 * | 6/2003 | Yasuhara | ..................... | 324/318 |
| 2004/0113620 A1 * | 6/2004 | Tsuda et al. | ................. | 324/320 |
| 2004/0251901 A1 * | 12/2004 | Tsuda et al. | ................. | 324/318 |
| 2006/0145699 A1 * | 7/2006 | Ham et al. | .................... | 324/322 |
| 2009/0079430 A1 * | 3/2009 | Yamashita | .................... | 324/318 |

FOREIGN PATENT DOCUMENTS

| | | |
|---|---|---|
| JP | 2-168936 | 6/1990 |
| JP | 2004-237125 | 8/2004 |
| JP | 2007-190200 | 8/2007 |

* cited by examiner

*Primary Examiner*—Brij B. Shrivastav
*Assistant Examiner*—Tiffany A Fetzner
(74) *Attorney, Agent, or Firm*—Nixon & Vanderhye PC

(57) ABSTRACT

A magnetic resonance apparatus gantry includes a cylindrical static magnet housing which accommodates a static field magnet and in which an opening portion is formed, a cylindrical gradient magnet housing which accommodates a gradient coil, is placed in the opening portion, and is shorter in length in an axial direction than the static magnet housing, and a support unit which supports the gradient magnet housing on the static magnet housing, and includes a first support member mounted on the static magnet housing, a second support member mounted on the gradient magnet housing and supported by the first support member, and an adjustment unit which is placed inside the static magnet housing in the axial direction and adjusts a relative positional relationship between the static magnet housing and the gradient magnet housing by changing the relative positional relationship between the first support member and the second support member.

14 Claims, 6 Drawing Sheets

MAGNETIC RESONANCE APPARATUS GANTRY AND MAGNETIC RESONANCE APPARATUS

CROSS-REFERENCE TO RELATED APPLICATIONS

This application is based upon and claims the benefit of priority from prior Japanese Patent Application No. 2007-245448, filed Sep. 21, 2007, the entire contents of which are incorporated herein by reference.

BACKGROUND OF THE INVENTION

1. Field of the Invention

The present invention relates to a magnetic resonance apparatus gantry which accommodates static field magnets in a static magnet housing in which, for example, a cylindrical space (opening portion) is formed, and in which a gradient magnet housing accommodating gradient coils is placed in the space formed by the static magnet housing, and a magnetic resonance apparatus.

2. Description of the Related Art

A magnetic resonance apparatus typified by a magnetic resonance imaging (MRI) apparatus is required to generate a very strong static magnetic field. A static magnetic field needs to allow a gradient magnetic field to be superimposed thereon. In general, therefore, a magnetic resonance apparatus accommodates static field magnets in a static magnet housing in which, for example, a cylindrical space is formed, and has a gradient magnet housing accommodating gradient coils which are housed in the space formed by the static magnet housing. The gradient magnet housing is cylindrical, and a static magnetic field and a gradient magnetic field are formed in the space formed inside the gradient magnet housing.

As a method of supporting the gradient magnet housing, there is available a method of supporting the gradient magnet housing by using the static magnet housing. This method is implemented by using a support unit comprising a support member mounted on a side end of the gradient magnet housing and a support member mounted on a side end of the static field magnet. The relative positional relationship between the static magnet housing and the gradient magnet housing is adjusted by pushing a support block mounted outside the end face of the static magnet housing with a positioning bolt.

Such techniques are known from, for example, Jpn. Pat. Appln. KOKAI Publication Nos. 2007-190200 and 2004-237725.

A magnetic resonance apparatus gantry is formed by covering a static magnet housing and a gradient magnet housing or all support units with a gantry housing. A space provided in the gantry housing is used as a diagnosis space, in which a subject is placed.

Recently, in order to improve the comfortableness of a diagnosis space for subjects, there have been increasing demands for a reduction in the axial dimension of the gantry. According to the prior art, however, the support unit protrudes to a side of the static magnet housing and gradient magnet housing. This is a hindrance to a reduction in the axial dimension of the gantry.

BRIEF SUMMARY OF THE INVENTION

Under the circumstances, it has been required to effectively reduce the axial dimension of a gantry by reducing the protrusion amount of a support unit axially.

According to a first aspect of the present invention, there is provided a magnetic resonance apparatus gantry comprising: a cylindrical static magnet housing which accommodates a static field magnet and in which an opening portion is formed; a cylindrical gradient magnet housing which accommodates a gradient coil, is placed in the opening portion, and is shorter in length in an axial direction than the static magnet housing; and a support unit which supports the gradient magnet housing on the static magnet housing, and includes a first support member mounted on the static magnet housing, a second support member mounted on the gradient magnet housing and supported by the first support member, and an adjustment unit which is placed inside the static magnet housing in the axial direction and adjusts a relative positional relationship between the static magnet housing and the gradient magnet housing by changing the relative positional relationship between the first support member and the second support member.

According to a second aspect of the present invention, there is provided a magnetic resonance apparatus gantry comprising: a static magnet housing which accommodates a static field magnet and in which an opening portion is formed; a gradient magnet housing which is placed in the opening portion and accommodates a gradient coil; and a support unit which supports the gradient magnet housing on the static magnet housing, and includes a first support member mounted on the static magnet housing, a second support member mounted on the gradient magnet housing, and an adjustment unit which adjusts a relative positional relationship between the static magnet housing and the gradient magnet housing in a second direction intersecting a first direction substantially parallel to a wall surface of the static magnet housing facing the opening portion and intersecting an opening direction of the opening portion by changing a relative positional relationship between the first support member and the second support member in the second direction upon movement of the adjustment member in the first direction.

According to a third aspect of the present invention, there is provided a magnetic resonance apparatus comprising: a static magnet housing which accommodates a static field magnet and in which a space is formed; a gradient magnet housing which accommodates a gradient coil, has a cylindrical shape shorter in length in an axial direction than the static magnet housing, and is placed in the space; and a support unit which is placed along a wall surface of the static magnet housing facing the space near an end portion of the static magnet housing and supports the gradient magnet housing on the static magnet housing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be described below with reference to the views of the accompanying drawing.

Figure 1:
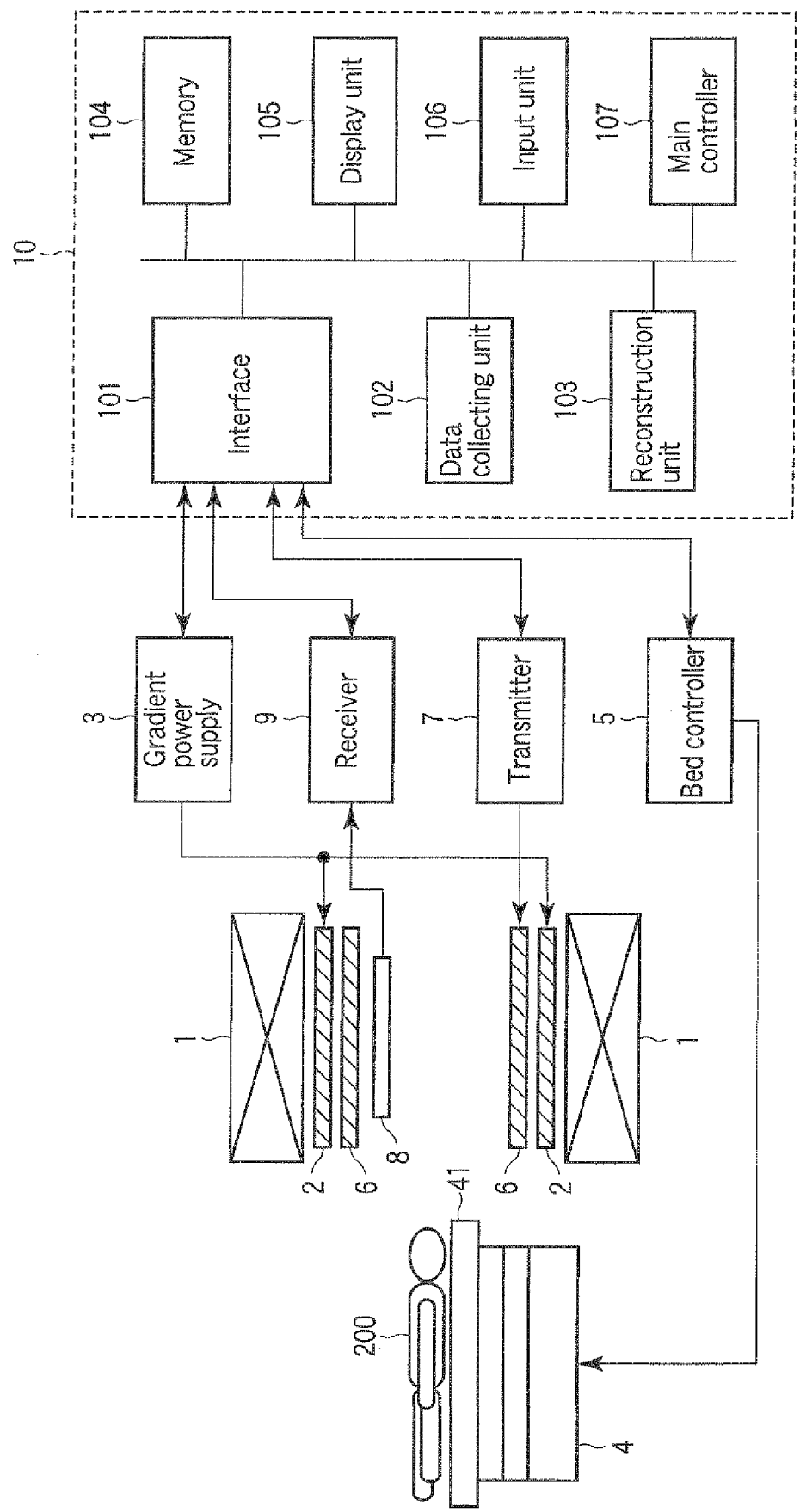
FIG. 1 is a block diagram showing the arrangement of a magnetic resonance imaging apparatus according to an embodiment of the present invention.

FIG. 1 is a block diagram showing the arrangement of a magnetic resonance imaging (MRI) apparatus according to this embodiment. As shown in FIG. 1, the MRI apparatus includes a static field magnet unit 1, a gradient coil unit 2, a gradient power supply 3, a bed 4, a bed controller 5, a transmission RF coil 6, a transmitter 7, a receiving RF coil 8, a receiver 9, and a computer system 10.

The static field magnet unit 1 is formed in the shape of a hollow cylinder and adapted to generate a uniform static magnetic field within its inside space. As the static field magnet unit 1, for example, a permanent magnet, a superconducting magnet, or the like is used.

The gradient coil unit 2 is formed in the shape of a hollow cylinder and placed inside the static field magnet unit 1. The gradient coil unit 2 is a combination of three types of coils respectively corresponding to the three mutually orthogonal X-, Y-, and Z-axes. When the three coils are individually supplied with currents from the gradient power supply 3, the gradient coil unit 2 generates gradient magnetic fields each of which has its strength varied along a corresponding one of the X-, Y-, and Z-axes. Suppose that the Z-axis direction coincides with the direction of the static magnetic field. The gradient magnetic fields along the X-, Y-, and Z-axis directions are used as a slice selecting gradient magnetic field Gs, a phase encoding gradient magnetic field Ge, and a readout gradient magnetic field Gr, respectively. The slice selecting gradient magnetic field Gs is used to arbitrarily determine an imaging plane section. The phase encoding gradient magnetic field Ge is used to change the phase of the magnetic resonance signals according to spatial location. The readout gradient magnetic field Gr is used to change the frequency of the magnetic resonance signals according to spatial location. Note that the longitudinal dimension of the gradient coil unit 2 is shorter than that of the static field magnet unit 1.

A gantry is formed by covering the static field magnet unit 1 and the gradient coil unit 2 with a gantry housing (not shown). In the gantry housing, a cylindrical opening portion is formed in the gradient coil unit 2, and an imaging space is formed inside the opening portion.

A subject 200 is placed on a top board 41 of the bed 4 and moved into the imaging space. Note that the shape of the imaging space is not limited to a cylindrical shape, and may be another shape such as a polygonal column shape. The top board 41 of the bed 4 is driven by the bed controller 5 to move longitudinally and vertically. Usually, the bed 4 is installed so that its longitudinal axis is parallel to the central axis of the static field magnet unit 1.

The transmission RF coil 6 is placed inside the gradient coil unit 2 and generates a radio-frequency magnetic field in response to a radio-frequency pulse from the transmitter 7.

The transmitter 7 transmits radio-frequency pulses corresponding to Larmor frequency to the transmitting RF coil 6.

The receiving RE coil 8 is placed inside the gradient coil unit 2 and adapted to receive magnetic resonance signals emitted from the subject 200 due to the influence of the radio-frequency magnetic field. The output signal from the receiving RF coil 8 is applied to the receiver 9.

The receiver 9 produces magnetic resonance signal data on the basis of the output signal from the receiving RF coil 8.

The computer system 10 includes an interface unit 101, a data collection unit 102, a reconstruction unit 103, a memory unit 104, a display unit 105, an input unit 106, and a main controller 107.

The interface unit 101 is connected to the gradient power supply 3, the bed controller 5, the transmitter 7, the receiving RF coil 8, the receiver 9, and the like. The interface unit 101 inputs/outputs signals exchanged between the respective units connected to the interface unit 101 and the computer system 10.

The data collection unit 102 collects via the interface unit 101 digital signals output from the receiver 9 and then stores the collected digital signals, i.e., the magnetic resonance signal data, into the memory unit 104.

The reconstruction unit 103 performs postprocessing, i.e., reconstruction, such as Fourier transforms, on the magnetic resonance signal data stored in the memory unit 104 to obtain spectrum data of desired nuclear spins within the subject 200 or image data.

The memory unit 104 stores magnetic resonance signal data and spectrum data or image data for each patient.

The display unit 105 displays a variety of information, such as spectrum data, image data, and the like, under the control of main controller 107. As the display unit 105, there is available a display device, such as a liquid crystal display.

The input unit 106 receives commands and information inputs from an operator. As the Input unit 106, there is available a pointing device such as a mouse or trackball, a selection device such as a mode changeover switch, or an input device such as a keyboard in accordance with the occasion.

The main controller 107 is equipped with a CPU, a memory, and the like, which are not shown in the block diagram and collectively controls the MRI apparatus of this embodiment. The main controller 107 has a variety of controlling functions to implement the known functions in the MRI apparatus.

Figure 2:
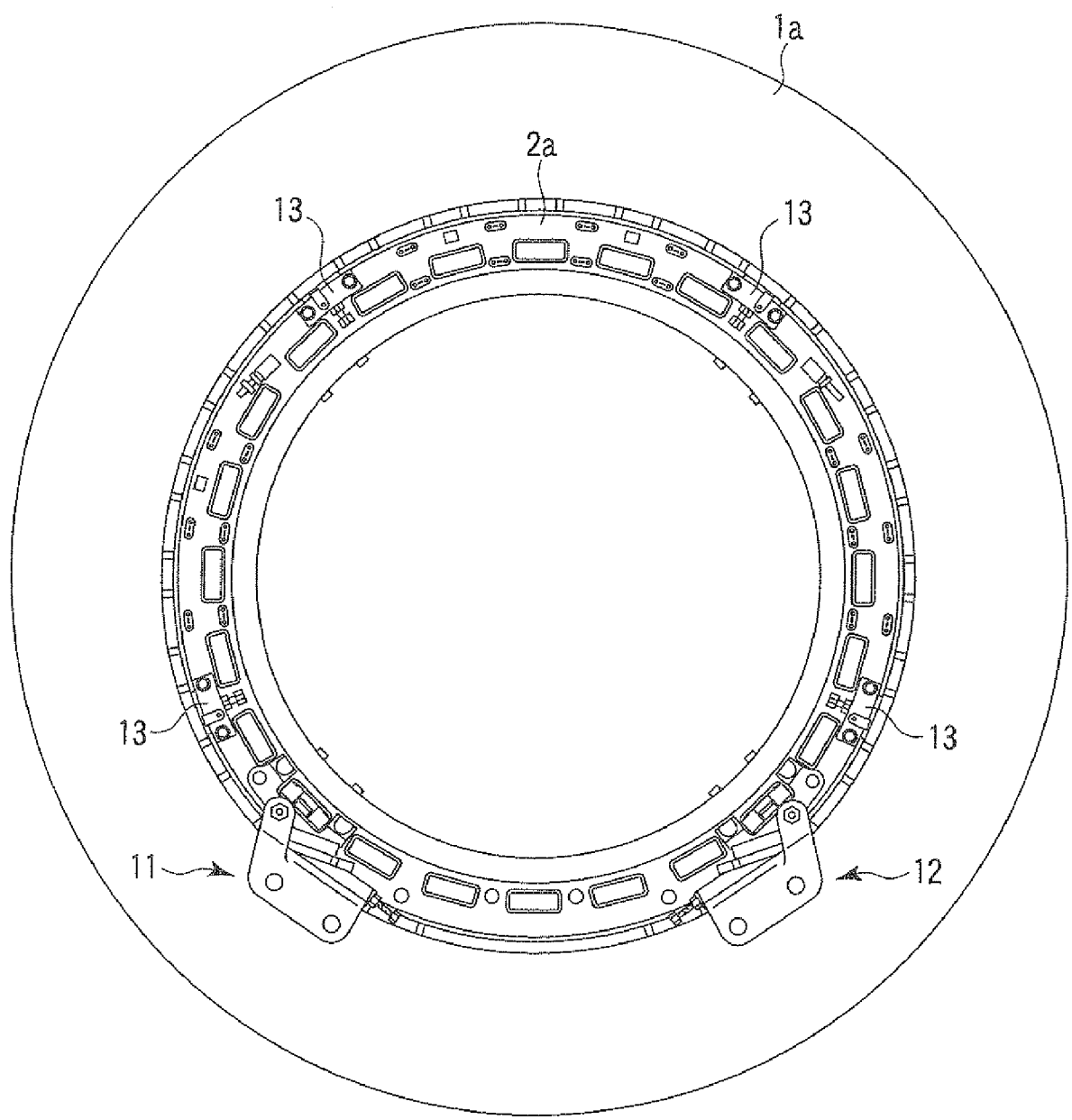
FIG. 2 is a view showing a static field magnet unit and a gradient coil unit in FIG. 1 when viewed from the left of FIG. 1.

FIG. 2 is a view showing the static field magnet unit 1 and the gradient coil unit 2 when viewed from the left side of FIG. 1.

A static magnet housing 1a and a gradient magnet housing 2a are the housings of the static field magnet unit 1 and gradient coil unit 2, respectively.

The static magnet housing 1a has a cylindrical space (opening portion) formed in its inside. The gradient magnet housing 2a is placed in this space. The inner diameter of the static magnet housing 1a is slightly larger than the outer diameter of the gradient magnet housing 2a. That is, the gradient magnet housing 2a is placed in the inside space of the static magnet housing 1a with a slight play. The gradient magnet housing 2a is supported by support units 11 and 12. The support units 11 and 12 are also provided on the opposite side of the static field magnet unit 1 and gradient coil unit 2 to that shown in FIG. 2.

That is, the gradient magnet housing 2a is supported by the two pairs of the support units 11 and the support units 12.

The support units 11 and 12 are symmetrical to each other in terms of structure and mounted state. The structure and mounted state of the support unit 11 will therefore be described in detail below.

Figure 3:
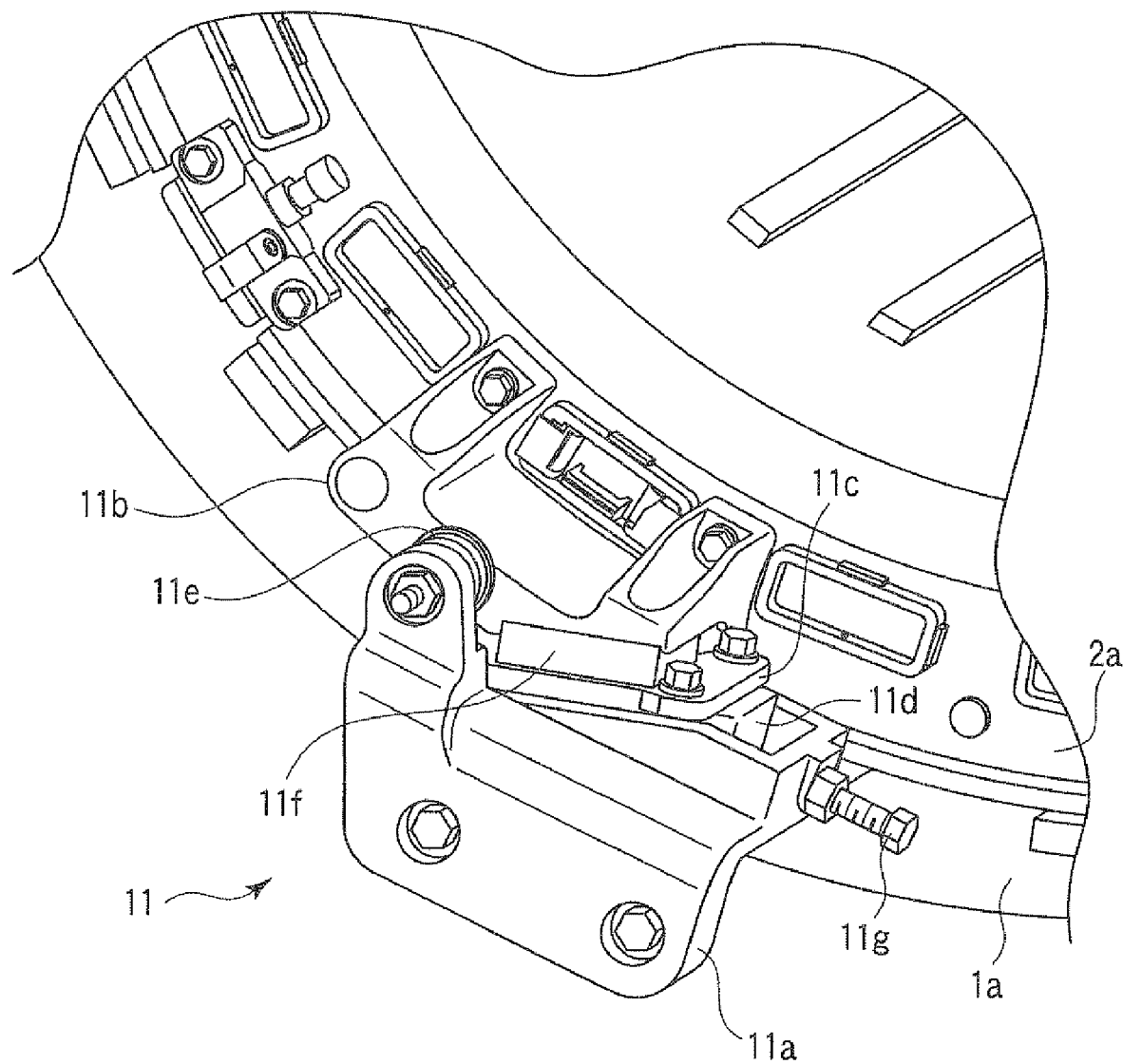
FIG. 3 is a perspective view of a support unit in FIG. 2.

FIG. 3 is a perspective view of the support unit 11.

As shown in FIG. 3, the support unit 11 includes a first support member 11a, a second support member 11b, first to third moving members 11c, 11d, and 11e, a vibration attenuation member 11f, and an adjustment member 11g.

Figure 4:
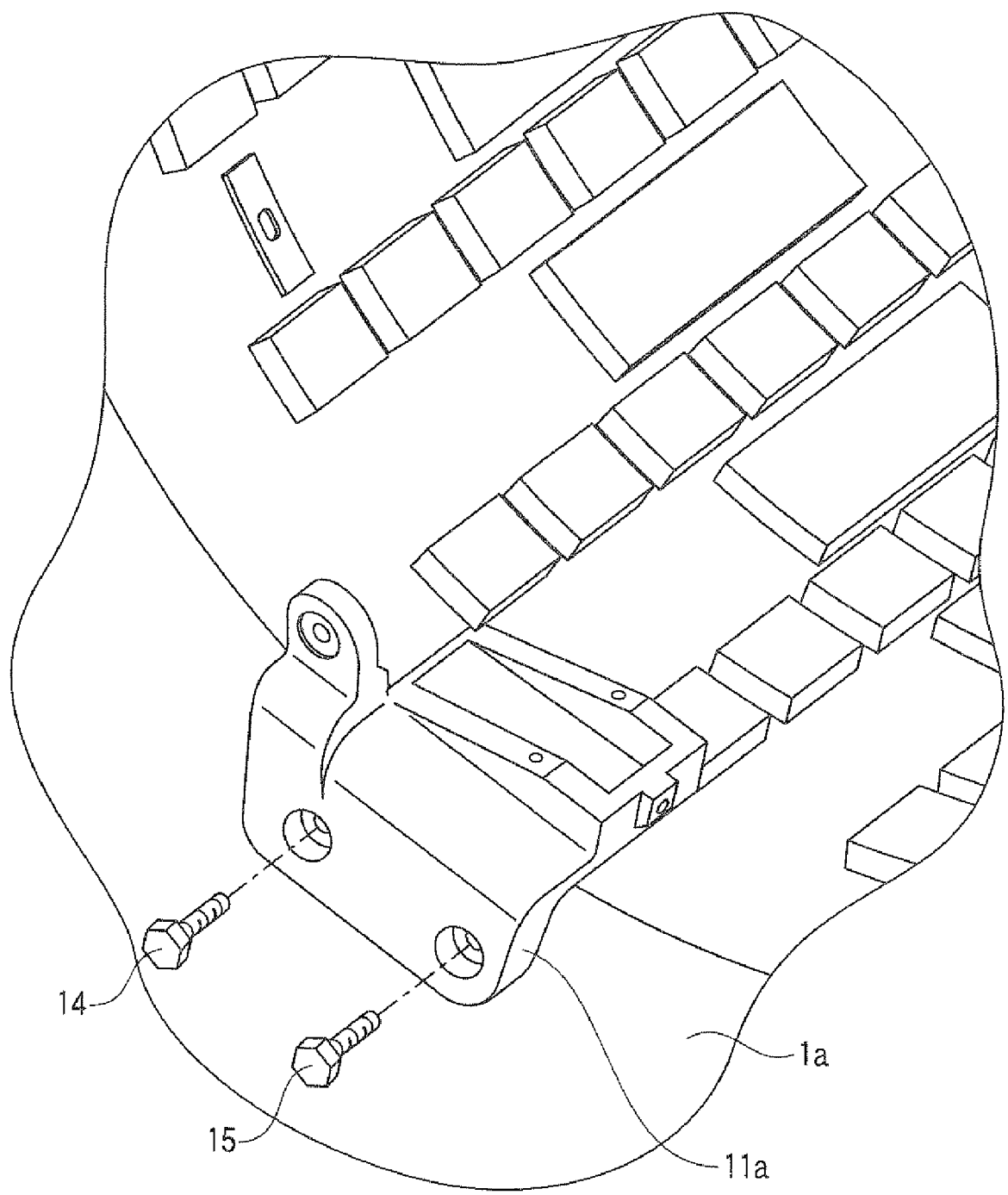
FIG. 4 is a perspective view showing now a first support member is fixed to the static magnet housing.

The first support member 11a is fixed to the static magnet housing 1a. The second support member 11b is fixed to the gradient magnet housing 2a. The first and second moving members 11c and 11d are movably supported by the first support member 11a. The third moving member 11e is placed between the first support member 11a and the second support member 11b. As the vibration attenuation member 11f, an elastic material such as rubber is used. The vibration attenuation member 11f is held tight between the second support member 11b and the first moving member 11e. The adjustment member 11g is guided into a through hole formed in the first support member 11a to be movably placed. FIG. 4 is a perspective view showing how the first support member 11a is fixed to the static magnet housing 1a.

The first support member 11a has two surfaces almost perpendicular to each other. The first support member 11a is placed such that the two surfaces are respectively in contact with the inner surface and side end face of the static magnet housing 1a. The first support member 11a is fixed to the static magnet housing 1a with bolts 14 and 15.

Figure 5:
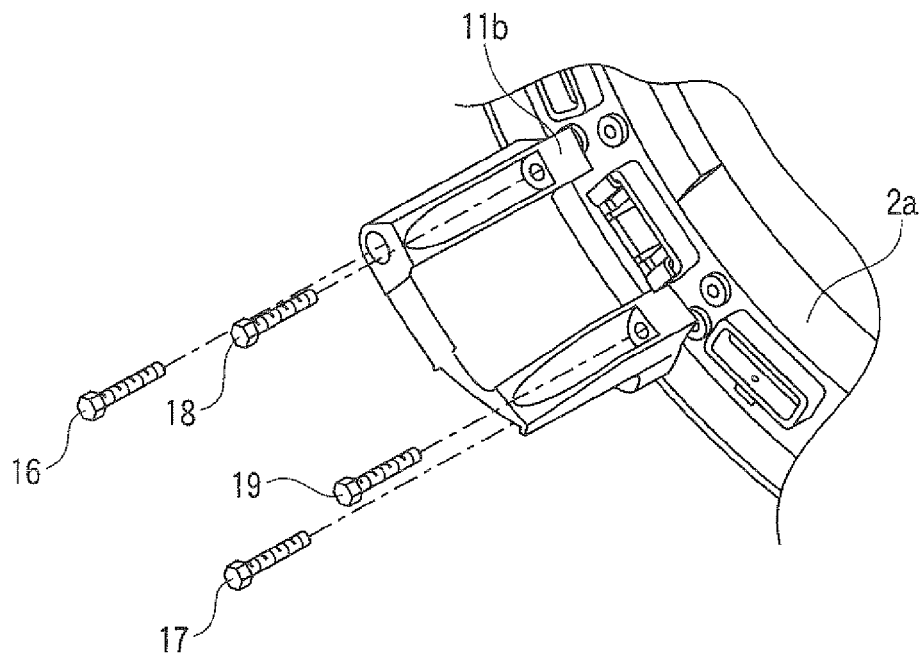
FIG. 5 is a perspective view showing how a second support member is fixed to the gradient magnet housing.

FIG. 5 is a perspective view showing how the second support member 11b is fixed to the gradient magnet housing 2a.

The second support member 11b is placed so as to protrude to a side of the gradient magnet housing 2a while one surface of the second support member 11b is in contact with a side end face of the gradient magnet housing 2a. The second support member 11b is fixed to the gradient magnet housing 2a with bolts 16, 17, 18, and 19.

Figure 6:
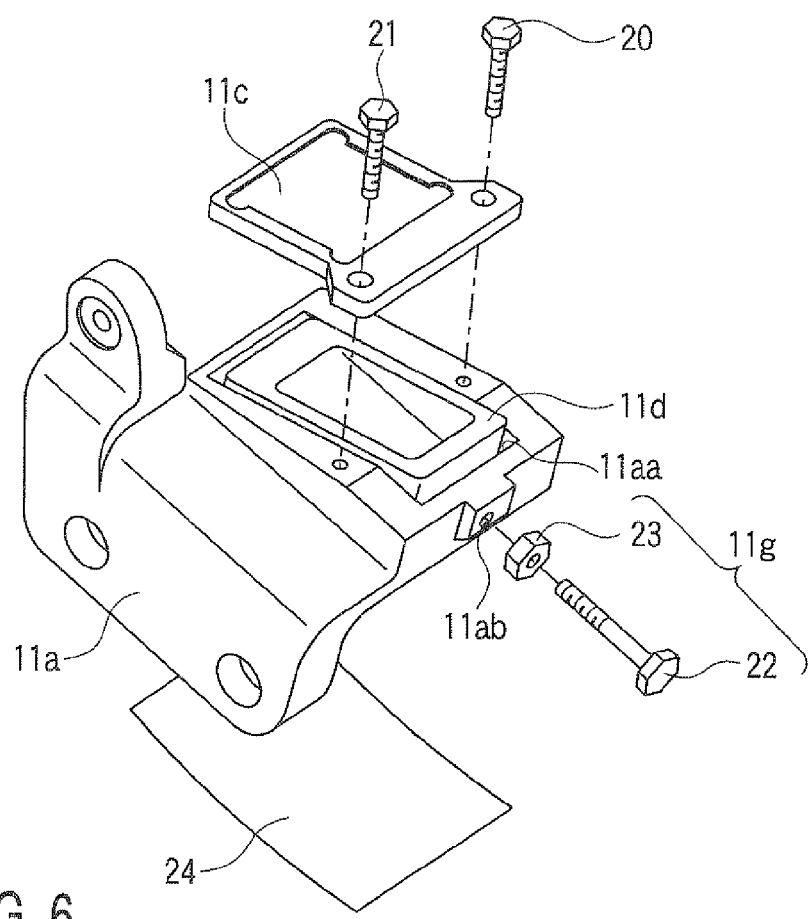
FIG. 6 is an exploded perspective view showing how first and second moving members are mounted on the first support member.

FIG. 6 is an exploded perspective view showing how the first and second moving members 11c and 11d are mounted on the first support member 11a.

The first moving member 11c is mounted on the first support member 11a with bolts 20 and 21. When the position of the gradient magnet housing 2a is adjusted, the bolts 20 and 21 are not so fastened as to fix the first moving member 11c. In this state, the first moving member 11c can be moved along the axial direction of the bolts 20 and 21 by being guided by the bolts 20 and 21. After the position of the gradient magnet housing 2a is adjusted, the bolts 20 and 21 are fastened to fix the first moving member 11c.

The second moving member 11d is fitted in a guide groove 11aa formed in the first support member 11a and then gently pressed by the first moving member 11c. The guide groove 11aa is provided in a portion, of the first support member 11a, which extends into the inside space of the static magnet housing 1a. The guide groove 11aa is formed to slidably guide the second moving member 11d in a direction extending almost parallel to the inner surface of the static magnet housing 1a. The second moving member 11d has a wedge-like shape. That is, a surface of the second moving member 11d which is exposed while the second moving member 11d is fitted in the guide groove 11aa is a inclined surface. The second moving member 11d is placed such that the inclined surface is inclined along the slidable direction.

The adjustment member 11g includes a bolt 22 and a nut 23. The bolt 22 extends through the nut 23 and a through hole 11ab provided in the first support member 11a. The distal end of the bolt 22 then comes into contact with the second moving member 11d. The bolt 22 can be moved along a direction which is almost parallel to the inner surface of the static magnet housing 1a and intersects the opening direction of the inside space of the static magnet housing 1a by being guided by the through hole 11ab. That is, the bolt 22 can move along the circumferential direction of the static magnet housing 1a.

A cushion 24 is placed between the static magnet housing 1a and the first support member 11a.

Figure 7:
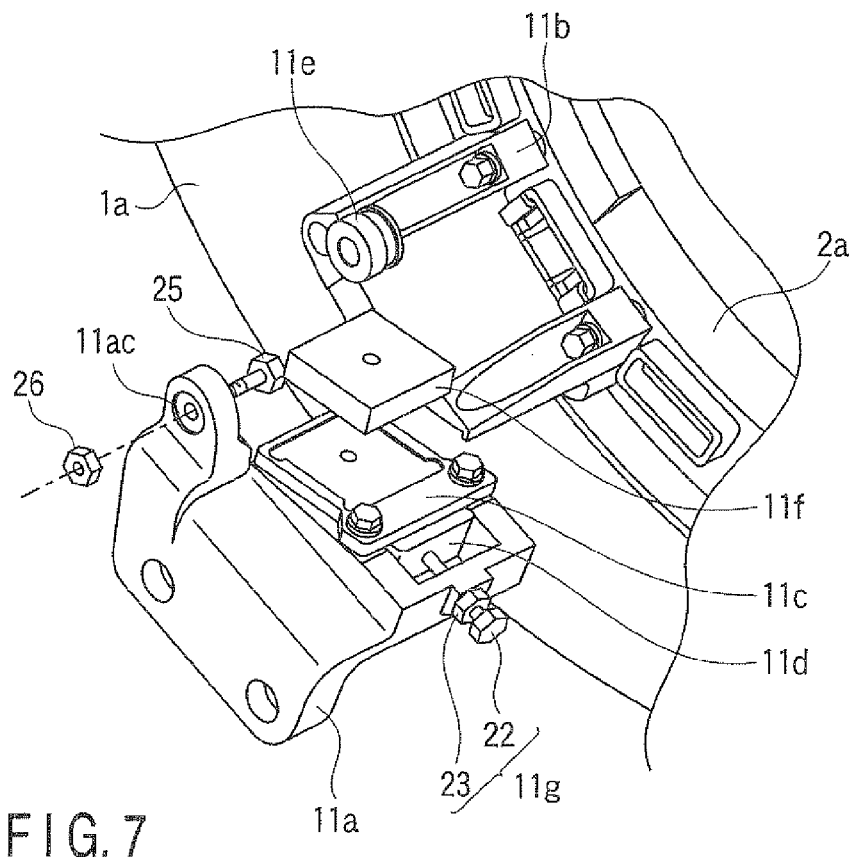
FIG. 7 is a perspective view showing a state at the time of assembly of a support unit.

At the time of assembly, as shown in FIG. 7, the gradient magnet housing 2a on which the second support member 11b is mounted is placed in the inside space of the static magnet housing 1a. Thereafter, as shown in FIG. 6, the first support member 11a on which the first and second moving members 11c and 11d are mounted is inserted between the inner surface of the static magnet housing 1a and the second support member 11b. In this case, the vibration attenuation member 11f is placed on the upper surface of the first moving member 11c so as to be positioned between the second support member 11b and the first moving member 11c. A bolt 25 is fastened to the first support member 11a via a through hole 11ac formed almost along the axial direction of the static field magnet unit 1 and a nut 26. The third moving member 11e is held tight between the distal end face of the second support member 11b and the third moving member 11e. Note that the moving member 11e comprises a vibration attenuation member and a member which supports the vibration attenuation member.

With this structure, increasing the penetration amount of the bolt 22 into the support unit 11 will cause the second moving member 11d to slide along the inner surface of the static magnet housing 1a. The first moving member 11c is then pushed upward by the inclined surface of the second moving member 11d. As a consequence, the distance between the first support member 11a and the second support member 11b increases.

The weight of the gradient coil unit 2 is applied to the first moving member 11c. For this reason, decreasing the penetration amount of the bolt 22 will cause the first moving member 11c to press the inclined surface of the second moving member 11d so as to make the second moving member 11d slide until it is locked by the bolt 22. The first moving member 11c then sinks. As a result, the distance between the first support member 11a and the second support member 11b decreases.

The first support member 11a is fixed to the static magnet housing 1a, and the second support member 11b is fixed to she gradient magnet housing 2a. If, therefore, the distance between the first support member 11a and the second support member 11b changes, the relative positional relationship between the static magnet housing 1a and the gradient magnet housing 2a changes. That is, the support unit 11 can adjust the relative positional relationship between the static magnet housing 1a and the gradient magnet housing 2a by adjusting the penetration amount of the bolt 22. In the support unit 11, the mechanism for adjusting the relative positional relationship between the static magnet housing 1a and the gradient magnet housing 2a is positioned in the inside space of the static magnet housing 1a. For this reason, the amount by which the support unit 11 protrudes from a side end of the static magnet housing 1a is small, and the amount by which the axial dimension of the gantry is increased by the support unit 11 is kept small. In addition, with the structure designed to move the bolt 22 along the circumferential direction of the static magnet housing 1a, the bolt 22 does not protrude outward from the inside space of the static magnet housing 1a.

From this viewpoint as well, the amount by which the support unit 11 protrudes from the side end of the static magnet housing 1a can be reduced, and hence the amount by which the axial dimension of the gantry is increased by the support unit 11 can be kept small. Note that the first support member 11a can be fixed to the inner surface of the static magnet housing 1a. In this case, the portion of the first support member 11a which protrudes from the side end of the static magnet housing 1a can be omitted, and the support unit 11 can be made not to protrude from the side end of the static magnet housing 1a.

On the other hand, rotating the nut 26 can change the penetration amount of the bolt 25, i.e., the position of the third moving member 11e. The axial position of the gradient magnet housing 2a in the axial direction can be adjusted by properly adjusting the position of the third moving member 11e in the support unit 11 and the position of the third moving member in the support member 12 on one end side and the other end side of the static magnet housing 1a.

According to this embodiment, providing the vibration attenuation member 11f can suppress the transmission of vibrations between the static magnet housing 1a and the gradient magnet housing 2a. This can reduce the vibrations and noise produced by the gantry. In addition, using the vibration attenuation member for the moving member 11e can also suppress the transmission of vibrations between the static magnet housing 1a and the gradient magnet housing 2a via the bolt 25. This can further reduce the vibrations and noise produced by the gantry.

This embodiment comprises the support units 11 and 12 and hence can arbitrarily adjust the relative positions of the static magnet housing 1a and gradient magnet housing 2a by properly setting the support units 11 and 12. However, since this adjustment is implemented by relatively adjusting the setting of the support units 11 and 12, it is cumbersome to finely adjust the relative positions of the static magnet housing 1a and gradient magnet housing 2a.

Figure 8:
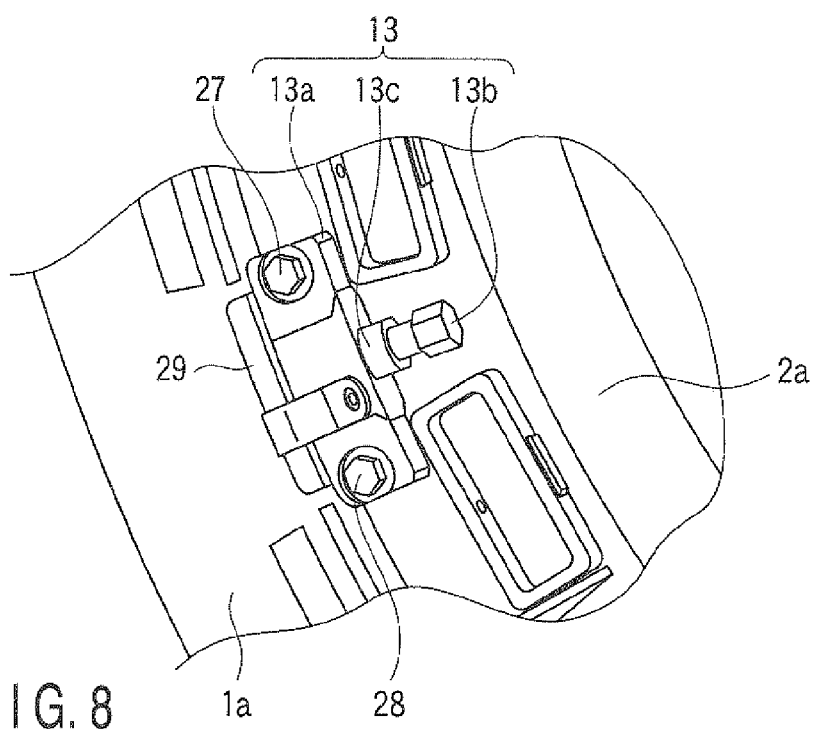
FIG. 8 is a perspective view showing the arrangement of an adjustment unit.

For this reason, this embodiment further comprises a plurality of adjustment units 13. FIG. 8 is a perspective view showing the arrangement of the adjustment unit 13.

The adjustment unit 13 includes a base portion 13a, an adjustment bolt 13b, and a nut 13c. The base portion 13a is fixed to a side end face of the gradient magnet housing 2a with bolts 27 and 28. As shown in FIG. 8, the base portion 13a has a through hole which faces in a direction perpendicular to the axis of the gradient magnet housing 2a while the base portion 13a is fixed to the gradient magnet housing 2a. The adjustment bolt 13b is placed such that its distal end protrudes from the base portion 13a via this through hole and the nut 13c. The distal end of the adjustment bolt 13b can come into contact with a vibration attenuation member 29 placed between the inner surface of the static magnet housing 1a and the adjustment units 13. Note that as the vibration attenuation member 29, an elastic material such as rubber is used.

Adjusting the protrusion amount of the distal end of the adjustment units 13 by adjusting the penetration amount of the adjustment bolt 13b can adjust the distance between the static magnet housing 1a at the contact position of the adjustment bolt 13b and the gradient magnet housing 2a. This makes it possible to finely adjust the relative positional relationship between the static magnet housing 1a and the gradient magnet housing 2a which are set by the support units 11 and 12.

According to this embodiment, providing the vibration attenuation member 29 can suppress the transmission of vibrations between the static magnet housing 1a and the gradient magnet housing 2a via the adjustment units 13. This can achieve reductions in vibrations and noise produced by the gantry.

This embodiment can be variously modified as follows. it is possible to omit one of the support units and 12. Alternatively, it is possible to increase the number of at least support units 11 or support members 12.

The first support member 11a can be divided into two separate portions, i.e., a portion which guides the second moving member 11d and a portion which holds the bolt 25.

Of the first support member 11a, the portion which holds the bolt 25, the third moving member 11e, the bolt 25, and the nut 26 can be omitted.

The number of adjustment units 13 can be arbitrary. The adjustment units 13 can be omitted.

The moving direction of the second moving member 11d and adjustment member 11g can be arbitrarily changed to be, for example, a direction almost parallel to the axial direction of the static magnet housing 1a. In this case, the adjustment member 11g may protrude outside from the inside space of the static magnet housing 1a. If, however, the amount by which the first support member 11a protrudes outside from the inside space of the static magnet housing 1a is the same as that in the above embodiment, an increase in the axial dimension of the gantry due to the protrusion of the adjustment member 11g is small.

Most part of the first support member 11a and part or all of the second support member 11b can protrude outside from the inside space of the static magnet housing 1a. In this case as well, since the adjustment member 11g does not protrude along the axis direction of the static magnet housing 1a, a reduction in the axial dimension of the gantry can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance apparatus gantry comprising:
a hollow cylindrical static magnet housing having an opening which accommodates therein a hollow cylindrical static field magnet;
a hollow cylindrical gradient magnet housing which accommodates therein a hollow cylindrical gradient magnetic field coil located inside said hollow static field magnet and of a shorter axial length than the static field magnet, the hollow cylindrical static and gradient magnet housings having approximately parallel axes;
a support unit which at least partially supports the gradient magnet housing on the static magnet housing, said support unit including a first support member mounted on the static magnet housing, a second support member mounted on the gradient magnet housing and supported by the first support member, and
an adjustment unit which is placed inside the static magnet housing in the axial direction and which is movable in a first circumferential direction of the opening of the static magnet housing that is transverse to the approximately parallel axes and configured to change the relative positional relationship between the first support member and the second support member, of the support unit, thereby adjusting a relative positional relationship between the static magnet housing and the gradient magnet housing in a second transverse direction with respect to the approximately parallel axes.

2. The magnetic resonance apparatus gantry according to claim 1, further comprising a vibration attenuation member which is placed between the first support member and the second support member, of the support unit and attenuates vibrations transmitted between the first support member and the second support member of the support unit.

3. The magnetic resonance apparatus gantry according to claim 1, wherein the adjustment unit comprises:
   a first moving member which is configured to move in the first circumferential direction in order to change a relative positional relationship between the first support member and the second support member, of the support unit, in the second direction upon movement of the first moving member, and
   a second moving member which is configured to move in the first circumferential direction in response to movement of the first moving member and which has an inclined surface in contact with at least one of said first and second support members of the support unit.

4. The magnetic resonance apparatus gantry according to claim 3, wherein the adjustment unit further comprises a first guide member which is fixed to the static magnet housing and guides the second moving member so as to allow the second moving member to move in the first circumferential direction.

5. The magnetic resonance apparatus gantry according to claim 3, wherein the adjustment unit further comprises a third moving member which is configured to move in a direction substantially parallel to an axial direction of the gradient magnet housing and which changes a relative positional relationship between the first support member and the second support member of the support unit, in the axial direction, upon movement of the third moving member.

6. The magnetic resonance apparatus gantry according to claim 1, which further comprises a fine adjustment unit fixed to the gradient magnet housing, and in which the fine adjustment unit comprises:
   a guide member which is fixed to an end portion of the gradient magnet housing so as to protrude to a side from the end portion,
   a moving member which is configured to move in a direction intersecting a wall surface of the static magnet housing facing the opening of the static magnet housing at a placement position of the fine adjustment unit while being guided by the guide member, and which changes a distance between the wall surface and the gradient magnet housing upon movement of the moving member, and
   a vibration attenuation member which is placed between the static magnet housing and the moving member and attenuates vibrations transmitted between the static magnet housing and the moving member.

7. A magnetic resonance apparatus gantry comprising:
   a static magnet housing having an opening therein, which accommodates a static field magnet;
   a gradient magnet housing disposed in the opening of the static magnet housing and accommodating therein, a gradient coil, the hollow cylindrical static and gradient magnet housings haying approximately parallel axes; and
   a support unit which supports the gradient magnet housing on the static magnet housing, said support unit including a first support member mounted on the static magnet housing, a second support member mounted on the gradient magnet housing, and
   an adjustment unit which adjusts a relative positional relationship between the static magnet housing and the gradient magnet housing in a second direction intersecting a first circumferential direction substantially parallel to a wall surface of the static magnet housing facing the opening of the static magnet housing and intersecting a facing direction of the opening of the static magnet housing by changing a relative positional relationship between the first support member and the second support member of the support unit in the second direction upon movement of the adjustment member in the first circumferential direction.

8. A magnetic resonance apparatus comprising:
   a hollow cylindrical static magnet housing which accommodates therein a hollow cylindrical static field magnet in which a space is formed;
   a hollow cylindrical gradient magnet housing which accommodates therein a hollow cylindrical gradient coil located inside said hollow static magnetic field magnet shorter in axial length than the static magnet housing, the hollow cylindrical static and gradient magnet housings having approximately parallel axes; and
   a support unit disposed along a wall surface of the static magnet housing facing the space near an end portion of the static magnet housing and supporting the gradient magnet housing on the static magnet housing in such a way as to cause a relative positional relationship between the static magnet housing and the gradient magnet housing in a direction intersecting the axial direction to be adjusted when at least part of said support unit is moved in a transverse circumferential direction of the space.

9. A magnetic resonance imaging (MRI) system gantry comprising:
   a hollow cylindrical field magnet having an axis along a first length and supported by a static magnet hollow cylindrical support structure;
   a hollow cylindrical gradient field magnet located inside said hollow cylindrical static magnetic field magnet having an axis along a second length shorter than said first length and supported by a gradient magnet hollow cylindrical support structure within said static field magnet, the cylindrical support structures having approximately parallel axes; and
   a plurality of adjustable position support units, each of which at least partially supports said gradient magnet hollow cylindrical support structure on said static magnet hollow cylindrical support structure, each of said adjustable position support units including:
   (a) a first member attached rigidly to said static magnet hollow cylindrical support structure,
   (b) a second member attached rigidly to said gradient magnet hollow cylindrical support structure, and
   (c) a wedge-shaped adjustment member in contact with said first and second members, said adjustment member being mounted and configured for adjustable movement with respect to said first and second members along a first circumferential direction transverse to said approximately parallel axes while causing relative movement between said approximately parallel axes in a second direction that is also transverse to said approximately parallel axes, said first circumferential transverse direction and said second transverse direction being different and also transverse with respect to each other.

10. The MRI systems gantry according to claim 9, wherein said adjustment member includes a vibration attenuation member placed between the first support member and the second support member in order to attenuate vibrations transmitted between the first support member and the second support member.

11. The MRI system gantry according to claim 9, wherein the adjustable position support comprises:
an adjustment screw configured to move in a direction substantially perpendicular to a radius of the static and gradient magnets and substantially perpendicular to the approximately parallel axes of the static and gradient magnets while engaging and moving an inclined surface in contact with at least one of the first and second members.

12. The MRI system according to claim 11, wherein the adjustable position support further comprises a first guide member fixed to the static magnet hollow cylindrical support structure and guiding the moving inclined surface member so as to allow it to move in the above-defined direction.

13. The MRI system gantry according to claim 11, wherein the adjustable position support further comprises another moving member configured to move in a direction substantially parallel to the approximately parallel axes of the static and gradient magnets while changing a relative positional relationship between the static magnet hollow cylindrical support structure and the gradient magnet hollow cylindrical support structure in a direction substantially parallel to the approximately parallel axes of said static and gradient magnets.

14. The MRI system gantry according to claim 9, which further comprises:
a plurality of fine adjustment units fixed to the gradient magnet hollow cylindrical support structure, and
in which each fine adjustment unit comprises:
a guide member fixed to an end portion of the gradient magnet support structure;
a moving member configured to move while guided by the guide member along a radial direction in order to change a distance between a static magnet wall surface and a gradient magnet upon movement of the moving member, and
a vibration attenuation member placed between the static magnet hollow cylindrical support structure and the moving member in order to attenuate vibrations transmitted between the static magnet hollow cylindrical support structure and the moving member.

* * * * *